United States Patent
Yin et al.

(10) Patent No.: US 8,692,335 B2
(45) Date of Patent: Apr. 8, 2014

(54) SOURCE/DRAIN REGION, CONTACT HOLE AND METHOD FOR FORMING THE SAME

(75) Inventors: Haizhou Yin, Poughkeepsie, NY (US); Huilong Zhu, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 222 days.

(21) Appl. No.: 13/119,074

(22) PCT Filed: Feb. 18, 2011

(86) PCT No.: PCT/CN2011/071086
§ 371 (c)(1),
(2), (4) Date: Mar. 15, 2011

(87) PCT Pub. No.: WO2011/131053
PCT Pub. Date: Oct. 27, 2011

(65) Prior Publication Data
US 2013/0015497 A1    Jan. 17, 2013

(30) Foreign Application Priority Data
Apr. 21, 2010    (CN) .......................... 2010 1 0156570

(51) Int. Cl.
*H01L 21/02* (2006.01)
(52) U.S. Cl.
USPC ............ 257/382; 257/E21.619; 257/E29.156; 438/478

(58) Field of Classification Search
USPC .......... 438/300, 504, 478; 257/190, E29.021, 257/192, 72, E21.619, 382, E29.156
See application file for complete search history.

(56) References Cited

U.S. PATENT DOCUMENTS

| 7,737,468 | B2 * | 6/2010 | Han et al. ...................... 257/192 |
| 8,058,133 | B2 * | 11/2011 | Tsai et al. ...................... 438/300 |
| 2003/0093762 | A1 * | 5/2003 | Rietman et al. .................... 716/2 |
| 2008/0048275 | A1 * | 2/2008 | Kawakita ....................... 257/412 |

OTHER PUBLICATIONS

International Search Report for PCT/CN2011/071086.
Written Opinion for PCT/CN2011/071086.

* cited by examiner

*Primary Examiner* — Jarrett Stark
*Assistant Examiner* — Shahed Ahmed
(74) *Attorney, Agent, or Firm* — Troutman Sanders LLP

(57) ABSTRACT

An S/D region including a first region and a second region is provided. The first region is located, with at least a partial thickness, in the substrate. The second region is formed on the first region and made of a material different from that of the first region. A method for forming an S/D region is further provided, and the method includes: forming trenches at both sides of a gate stack structure in a substrate; forming a first semiconductor layer, wherein at least a part of the first semiconductor layer is filled into the trenches; and forming a second semiconductor layer on the first semiconductor layer, wherein the second semiconductor layer is made of a material different from that of the first semiconductor layer. A contact hole and a forming method thereof are also provided which may increase the contact area between a contact hole and a contact region, and reduce the contact resistance.

22 Claims, 4 Drawing Sheets

SOURCE/DRAIN REGION, CONTACT HOLE AND METHOD FOR FORMING THE SAME

BENEFIT CLAIMS

This application is a US National Stage of International Application No. PCT/CN2011/071086, filed Feb. 18, 2011, which claims the benefit of CN 201010156570.1, filed Apr. 21, 2010.

FIELD OF THE INVENTION

The present invention relates to a technical field of semiconductors, and particularly, to a source/drain region, a contact hole and a forming method thereof.

BACKGROUND OF THE INVENTION

With the gradual decrease of the critical size of semiconductor devices, various micro effects begin to occur, and it is becoming more difficult to optimize the performance of the semiconductor device, wherein the research for reducing the contact resistance of the contact hole of the source/drain (S/D) region is very challenging and practically significant.

As illustrated in FIG. 1, an S/D region 40 may be made of semiconductor material. The S/D region 40 is located at both sides of a gate stack structure (the gate stack structure includes a gate dielectric layer 12 formed on a substrate 10, a gate 14 formed on the gate dielectric layer 12, and sidewall spacers 16 surrounding the gate dielectric layer 12 and the gate 14) and embedded into the substrate 10. The difference between an actual height and a target height of the S/D region 40 is less than an error standard. In order to reduce the contact resistance, when a contact hole 30 abutting the S/D region 40 is formed in an interlayer dielectric layer 20, a contact region 18 (e.g., metal silicide) shall be formed on the surface of the S/D region 40 after the contact hole 30 is formed, so that the contact hole 30 abuts the S/D region 40 via the contact region 18. Thus, the key for the reduction of the contact resistance is to reduce a resistance of the contact region 18.

In order to reduce the resistance of the contact region, theoretically, a technical solution increasing the area of the contact region may be adopted. However, with the gradual decrease of the critical size of semiconductor devices, the critical size of the contact hole also gradually decreases, and it becomes a major problem urgently to be solved by a person skilled in the art to increase the area of the contact region in practice.

SUMMARY OF THE INVENTION

In order to solve the above problem, the present invention provides an S/D region and a forming method thereof, which may increase the contact area between a contact hole and a contact region and reduce the contact resistance when the contact region is formed on the S/D region to bear the contact hole having a determined size; and the present invention also provides a contact hole and a forming method thereof, which may increase the contact area and reduce the contact resistance when the contact hole abuts the S/D region via the contact region.

The present invention provides an S/D region made of a semiconductor material, located at both sides of a gate stack structure and embedded into a substrate, comprising: a first region located, with at least a partial thickness, in the substrate; and a second region formed on the first region and made of a material different from that of the first region.

Optionally, the second region comprises: an auxiliary layer configured to bear an embedded contact hole when the contact hole is formed on the S/D region; and a stop layer configured to terminate the contact hole above an interface between the gate stack structure and the substrate.

Optionally, in a PMOS device formed on the substrate of Si, the first region is made of SiGe, the stop layer is made of Si, and the auxiliary layer is made of SiGe. Optionally, in an NMOS device formed on the substrate of Si, the first region is made of $Si_{1-x}C_x$, the stop layer is made of Si, and the auxiliary layer is made of SiGe.

Optionally, in a CMOS device including the S/D region, the first region provides a compressive stress to the channel region of a PMOS device, and provides a tensile stress to the channel region of an NMOS device.

Optionally, the first region in the PMOS device is made of a material different from that of the first region in the NMOS device.

Optionally, the second region in the PMOS device is made of a material the same as that of the second region in the NMOS device.

The present invention provides a contact hole embedded into the S/D region, and an interface between the bottom surface of the contact hole and the S/D region is above or flushed with an interface between a gate stack structure and a substrate.

Optionally, after a contact region is formed on the top surface of the S/D region exposed by the contact hole, the interface between the bottom surface of the contact region and the S/D region is above or flushed with the interface between the gate stack structure and the substrate.

The present invention provides a contact hole embedded into an S/D region, and an interface between the bottom surface of the contact hole and the S/D region is above or flushed with an interface between a gate stack structure and a substrate; the S/D region is made of a semiconductor material, located at both sides of the gate stack structure and embedded into the substrate; and the height difference between the top surface of the S/D region and the interface between the gate stack structure and the substrate is larger than a difference between the actual height and the target height of the S/D region.

Optionally, after a contact region is formed on the top surface of the S/D region exposed by the contact hole, the interface between the bottom surface of the contact region and the S/D region is above or flushed with the interface between the gate stack structure and the substrate.

The present invention provides a method for forming an S/D region, including: forming trenches at both sides of a gate stack structure in a substrate; forming a first semiconductor layer, wherein at least a part of the first semiconductor layer is filled into the trenches; and forming a second semiconductor layer on the first semiconductor layer, wherein the second semiconductor layer is made of a material different from that of the first semiconductor layer.

Optionally, the step of forming the second semiconductor layer comprising:

forming an auxiliary layer configured to bear an embedded contact hole when the contact hole is formed on the S/D region; and forming a stop layer configured to terminate the contact hole above an interface between the gate stack structure and the substrate.

Optionally, in a PMOS device formed on a substrate of Si, the first region is made of a material SiGe, the stop layer is made of Si, and the auxiliary layer is made of SiGe.

Optionally, in an NMOS device formed on the substrate of Si, the first region is made of a material Si1-xCx, the stop layer is made of Si, and the auxiliary layer is made of SiGe.

Optionally, in a CMOS device including the S/D region, the first semiconductor layer provides a compressive stress to the channel region of a PMOS device, and provides a tensile stress to the channel region of an NMOS device.

Optionally, the first semiconductor layer in the PMOS device is made of a material different from that of the first semiconductor layer in the NMOS device.

Optionally, the second semiconductor layer in the PMOS device is made of a material the same as that of the second semiconductor layer in the NMOS device.

The present invention provides a method for forming a contact hole, including: forming an S/D region by the above method; and embedding a contact hole into the S/D region, wherein an interface between the bottom surface of the contact hole and the S/D region is above or flushed with the interface between the gate stack structure and the substrate.

Optionally, after a contact region is formed on the top surface of the S/D region exposed by the contact hole, the interface between the bottom surface of the contact region and the S/D region is above or flushed with the interface between the gate stack structure and the substrate.

The present invention provides a method for forming a contact hole, including: forming trenches at both sides of a gate stack structure in a substrate; forming a semiconductor layer, wherein the height difference between the top surface of the semiconductor layer and the interface between the gate stack structure and the substrate is larger than a difference between the actual height and the target height of the semiconductor layer; and embedding a contact hole into the semiconductor layer, wherein an interface between the bottom surface of the contact hole and the semiconductor layer is above or flushed with the interface between the gate stack structure and the substrate.

Optionally, after a contact region is formed on the top surface of the S/D region exposed by the contact hole, the interface between the bottom surface of the contact region and the S/D region is above or flushed with the interface between the gate stack structure and the substrate.

As compared with the prior art, the technical solution of the present invention has the following advantages.

Since the S/D region includes a first region having at least a partial thickness located within the substrate, and a second region formed on the first region and made of a material different from that of the first region (in other words, the top surface of the S/D region is above the interface between the gate stack structure and the substrate), when the contact hole is subsequently formed, a groove needs to be formed on the top surface of the S/D region, and a contact region shall be formed at a bottom side and a side surface of the groove, respectively, so that the contact hole abuts the S/D region via a portion of its side surface close to the bottom surface, as well as via its bottom surface, which increases the contact area and is beneficial to reduce the contact resistance, as compared with the technical solution in which the contact hole abuts the S/D region only via its bottom surface. Further, the groove may be formed in the second region and terminate above the first region by selecting appropriate etchant, and then the profile of the groove can be adjusted by adjusting the thickness of the second region, so as to flexibly adjust the size of the contact area.

By including an auxiliary layer and a stop layer in the second region, it is beneficial to form the groove in the second region and terminate the groove above the first region, when there is no obvious difference between the etching rates of the second region and the first region, and then the profile of the groove can be adjusted by adjusting the thickness of the second region, so as to flexibly adjust the size of the contact area.

Since the second region in the PMOS device is made of a material the same as that of the second region in the NMOS device, the contact holes in the S/D regions can be synchronously formed for the CMOS device including the PMOS device and the NMOS device, which not only reduces the contact resistance, but also simplifies the process.

DETAILED DESCRIPTION OF THE EMBODIMENTS

The following disclosure provides several different embodiments or examples to implement the technical solution of the present invention. Although components and arrangements of specific examples are described in the following, they are just exemplary and do not intend to limit the present invention.

In addition, the reference numbers and/or letters in different embodiments may be repeated in the present invention. Such repetition is made for the purposes of simplification and clearness, and it does not indicate the relationships between the discussed embodiments and/or arrangements.

The present invention provides various examples of specific processes and/or materials, but it is obvious that substitutive applications of other processes and/or materials conceivable by a person skilled in the art do not deviate from the scope of the present invention. To be emphasized, the boundaries of the various regions as described herein include necessary extensions made upon the demand of process or procedure.

Figure 1:
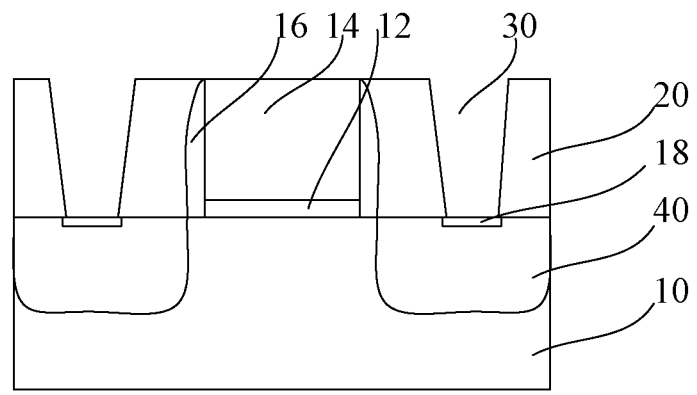
FIG. 1 is a structural diagram after a contact hole is formed on an S/D region according to the prior art.
Figure 2:
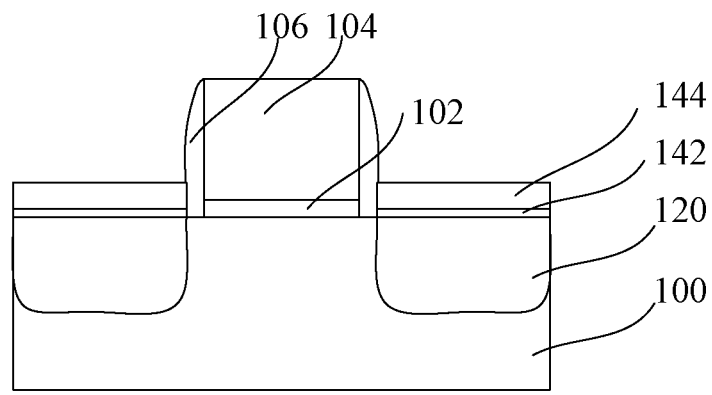
FIG. 2 is a structural diagram of a first embodiment of an S/D region according to the present invention.

As illustrated in FIG. 2, in the first embodiment of the S/D region, the S/D region is made of semiconductor material, located at both sides of a gate stack structure and embedded into a substrate 100. The S/D region includes: a first region 120 located within the substrate 100; a second region formed on the first region 120; wherein the second region includes: an auxiliary layer 144 configured to bear an embedded contact hole when the contact hole is formed on the S/D region; a stop layer 142 configured to terminate the contact hole above the interface between the gate stack structure and the substrate 100; in a CMOS device including the S/D region, the first region 120 provides a compressive stress to the channel region of a PMOS device, and provides a tensile stress to the channel region of an NMOS device; the first region 120 in the PMOS device is made of a material different from that of the first region 120 in the NMOS device; and the second region in the PMOS device is made of a material different from that of the second region in the NMOS device. The target height herein refers to a theoretical height required by the procedure.

For example, if the height of the S/D region shall be 2,000 Å in order to meet the design requirements, then the target height is 2,000 Å. The error standard refers to an error range meeting the process requirements. For example, if, under a certain process condition, it is specified that the height of the S/D region with a deviation of less than or equal to ±5% meets the process requirement, then the error standard is the error range of less than or equal to ±5%. The actual height refers to the practical height meeting the process requirement used to achieve the target height, e.g., when the target height is 2,000 Å and the error standard is less than or equal to ±5%, for an S/D region having a height of 2,050 Å that meets the process requirement, the actual height of the S/D is 2,050 Å.

In detail, the substrate 100 herein has undergone processing operations including pre-cleaning, well region formation and shallow trench isolation (STI) region formation. In the present embodiment, the substrate 100 is a silicon substrate, and in other embodiments, the substrate 100 may also include other compound semiconductor such as silicon carbide (SiC), gallium arsenide (GaAs), indium arsenide (InAs) or indium phosphide (InP). In addition, the substrate 100 preferably includes an epitaxial layer. The substrate 100 may also include a silicon on insulator (SOI) structure.

The gate stack structure includes a gate dielectric layer 102 formed on the substrate 100, a gate 104 formed on the gate dielectric layer 102, and sidewall spacers 106 surrounding the gate dielectric layer 102 and the gate 104. The gate 104 includes a poly-silicon gate, a poly-silicon dummy gate or a metal gate (In this specification, the gate 104 is a poly-silicon gate or a poly-silicon dummy gate in the description of the embodiments of the S/D region; and the gate 104 may be a poly-silicon gate or a metal gate in the description of the embodiments of the contact hole). The gate dielectric layer 102 may be made of hafnium-based materials such as one of $HfO_2$, HfSiO, HfSiON, HfTaO, HfTiO and HfZrO or any combination thereof. The materials for sidewall spacers 106 may include one of SiN, SiO, SiON and SiC or any combination thereof. The sidewall spacers may have a multi-layer structure. The gate dielectric layer 102, the sidewall spacers 106 and the above processing operations can be formed or implemented by conventional processes.

The semiconductor materials for the S/D region includes Si, SiGe (the atomic percent of Ge may be 40%, and the content of Ge may be flexibly adjusted according to the process requirements, e.g., 30%-50%; unless otherwise specified, the atomic percent of Ge in this specification is the same as that indicated herein and will not be described repeatedly) or $Si_{1-x}C_x$ (the atomic percent of C may be 0-2%, and the content of C may be flexibly adjusted according to the process requirements; unless otherwise specified, the atomic percent of C in this specification is the same as that indicated herein and will not be described repeatedly). To be noted, the semiconductor materials may be a semiconductor material doped with ions, e.g., Si, SiGe or $Si_{1-x}C_x$ of N type or P type. The ion doped semiconductor material may be formed directly during the production of the semiconductor material (e.g., doping a reactant containing the doped ion components into the reactants for producing the semiconductor material), or may be formed by an ion implantation process after the semiconductor material is produced. Any conventional ion implantation process may be adopted to perform the ion doping operation and herein is not described in detail.

In the present embodiment, in the CMOS device including the S/D region, the first region 120 in the PMOS device is made of SiGe, the first region 120 in the NMOS device is made of $Si_{1-x}C_x$, so that the first region 120 provides a compressive stress to the channel region of the PMOS device, and provides a tensile stress to the channel region of the NMOS device, which is beneficial to improve the performance of the CMOS device. In other embodiments of the S/D region, the first regions 120 in the PMOS and NMOS devices may alternatively use other different semiconductor materials. The first region 120 in the PMOS device may also be made of a material the same as that of the first region 120 in the NMOS device. In this case, in order that the first regions 120 provides a compressive stress to the channel region of the PMOS device and provides a tensile stress to the channel region of the NMOS device, the materials of the first regions 120 in the PMOS and NMOS devices may be formed by adopting different processes.

In the present embodiment, the second region in the PMOS device is made of a material the same as that of the second region in the NMOS device, i.e., the auxiliary layer 144 and the stop layer 142 in the PMOS device is made of a material the same as that of the auxiliary layer 144 and the stop layer 142 in the NMOS device, respectively. In other words, the second regions in the PMOS and NMOS devices are synchronously formed, which not only reduces the contact resistance, but also simplifies the process. Specifically, when the first region 120 in the PMOS device is made of SiGe and the first region 120 in the NMOS device is made of $Si_{1-x}C_x$, the auxiliary layer 144 is preferably made of SiGe, or $Si_{1-x}C_x$, and the stop layer 142 may be made of Si (in practice, with respect to the 32 nm process, the thickness of the stop layer 142 may be 5 nm). In this case, it is still possible to adjust the stress in the channel regions of the PMOS device and the NMOS device by selecting the materials of the second regions in the PMOS and NMOS devices, or the processes for forming the materials. The detailed adjusting method is the same as that for adjusting the stress in the channel region of a device by utilizing the first region, and herein is not described in detail.

In this case, the auxiliary layer 144 is configured to bear an embedded contact hole when the contact hole is formed on the S/D region; the stop layer 142 is configured to terminate the contact hole above the interface between the gate stack structure and the substrate 100. By including the auxiliary layer 144 and the stop layer 142 in the second region, it is beneficial for a groove that bears the contact hole to be formed in the second region and terminate above the first region 120 when there is no obvious difference between the etching rates of the second region 140 and the first region 120, and then the profile of the groove can be adjusted by adjusting the thickness of the second region 140, so as to flexibly adjust the size of the contact area.

In different embodiments of the S/D region, the second regions in the PMOS and NMOS devices may be made of a material different from each other, i.e., the auxiliary layer 144 and/or the stop layer 142 in the PMOS device may be made of a material different from that in the NMOS device, respectively; and in this case, the second regions in the PMOS and NMOS devices need to be formed separately.

In different embodiments of the S/D region, the interface between the stop layer 142 and the first region 120 may coincide with or be located above the interface between the gate stack structure and the substrate 100. When the interface between the stop layer 142 and the first region 120 is flushed with the interface between the gate stack structure and the substrate 100, it is beneficial to make the technical solution of the present invention compatible with existing formation processes of the S/D region. When the interface between the stop layer 142 and the first region 120 is located above the interface between the gate stack structure and the substrate 100, the interface between the S/D region and a contact region (e.g., a metal silicide layer formed by depositing metals on the S/D region and performing an annealing operation, the metal materials includes one of Co, Ni, Mo, Pt and W or any combination thereof), which is introduced after the embedded contact hole is formed in the auxiliary layer 144 and the stop layer 142 to reduce the contact resistance between the conductive material (e.g., metals) filled into the contact hole and the S/D region, may be formed above the interface between the gate stack structure and the substrate 100 through process adjustment. This contributes to reduction of the stress loss of the channel region of the device, and improvement of the mobility of the carrier.

Figure 3:
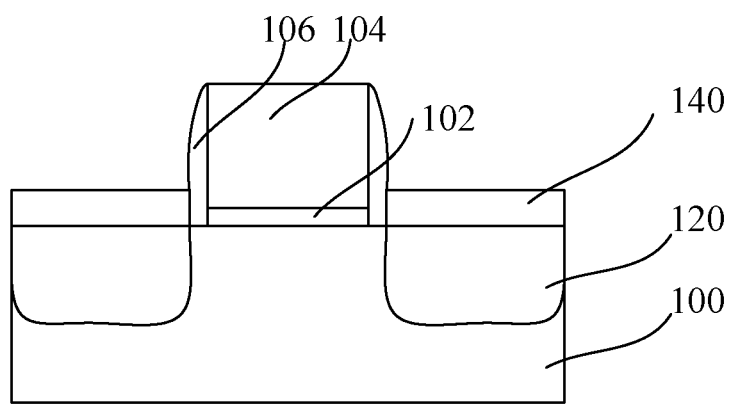
FIG. 3 is a structural diagram of a second embodiment of an S/D region according to the present invention.

As illustrated in FIG. 3, in the second embodiment of the S/D region, the S/D region is made of semiconductor material, located at both sides of a gate stack structure and embedded into a substrate 100. The S/D region includes: a first region 120 located, with at least a partial thickness, in the substrate 100; a second region 140 formed on the first region 120 and made of a material different from that of the first region 120. In a CMOS device including the S/D region, the first region 120 in the PMOS device is made of a material different from that of the first region 120 in the NMOS device; and the second region 140 in the PMOS device is made of a material the same as that of the second region 140 in the NMOS device.

In the present embodiment, the descriptions of the semiconductor material, the gate stack structure, the substrate 100 and the first region 120 are the same as those in the aforementioned embodiment, and herein are not repeated.

In the present embodiment, the second region 140 in the PMOS device is made of a material the same as that of the second region 140 in the NMOS device. In other words, the second regions 140 in the PMOS and NMOS devices are synchronously formed, which not only reduces the contact resistance, but also simplifies the process. In detail, when the first region 120 in the PMOS device is made of SiGe and the first region 120 in the NMOS device is made of $Si_{1-x}C_x$, the second regions 140 in the PMOS and NMOS devices may be made of Si.

As the second region 140 is made of a material different from that of the first region 120, the contact hole subsequently formed on the S/D region may terminate above the interface between the gate stack structure and the substrate. A groove that bears the contact hole may be formed in the second region 140 and terminate above the first region 120 by selecting appropriate etchant, and then the profile of the groove can be adjusted by adjusting the thickness of the second region 140, so as to flexibly adjust the size of the contact area.

An interface between the second region 140 and the first region 120 may coincide with or be located above the interface between the gate stack structure and the substrate 100. When the interface between the second region 140 and the first region 120 is flushed with the interface between the gate stack structure and the substrate 100, it contributes to the compatibility of the technical solution of the present invention with the existing formation process of the S/D region. When the interface between the second region 140 and the first region 120 is located above the interface between the gate stack structure and the substrate 100, an interface between the S/D region and a contact region, which is introduced after the embedded contact hole is formed in the second region 140 to reduce the contact resistance between the conductive material (e.g., metals) filled into the contact hole and the S/D region, may be formed above the interface between the gate stack structure and the substrate through process adjustment. This contributes to reduction of the stress loss of the channel region of the device, and improvement of the mobility of the carrier.

Figure 4:
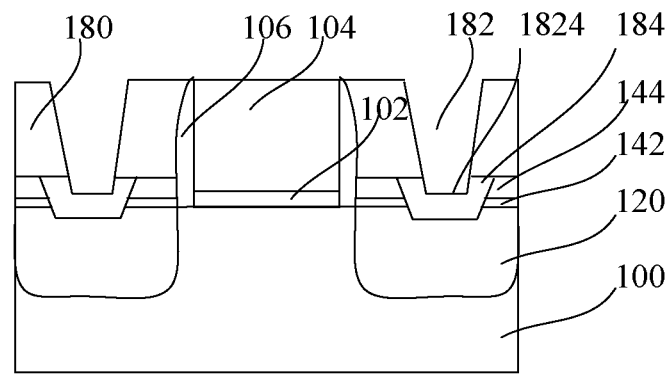
FIG. 4 is a structural diagram of a first embodiment of a contact hole according to the present invention.

The present invention further provides a contact hole. On the basis of the embodiments of the S/D region, as illustrated in FIG. 4, after being formed on the S/D region, an interlayer dielectric layer 180 is patterned to form a contact hole 182 penetrating the interlayer dielectric layer 180 and terminating in the S/D region.

In a first embodiment of the contact hole 182 (herein, the S/D region is implemented by the technical solution provided in the first embodiment), the interface 182A between the contact hole 182 and the S/D region is above the interface between the gate stack structure and the substrate 100. In other embodiments of the contact hole 182, the interface between the contact hole 182 and the S/D region may coincide with the interface between the gate stack structure and the substrate 100. When the interface between the contact hole 182 and the S/D region is flushed with the interface between the gate stack structure and the substrate 100, it contributes to the compatibility of the technical solution of the present invention with the existing formation process of the contact hole. When the interface between the contact hole 182 and the S/D region is located above the interface between the gate stack structure and the substrate 100, an interface between the S/D region and a contact region 184, which is introduced after the contact hole 182 is formed in the second region 140 to reduce the contact resistance between the conductive material (e.g., metals) filled into the contact hole 182 and the S/D region, may be formed above the interface between the gate stack structure and the substrate through process adjustment. This contributes to reduction of the stress loss of the channel region of the device, and improvement of the mobility of the carrier.

Figure 5:
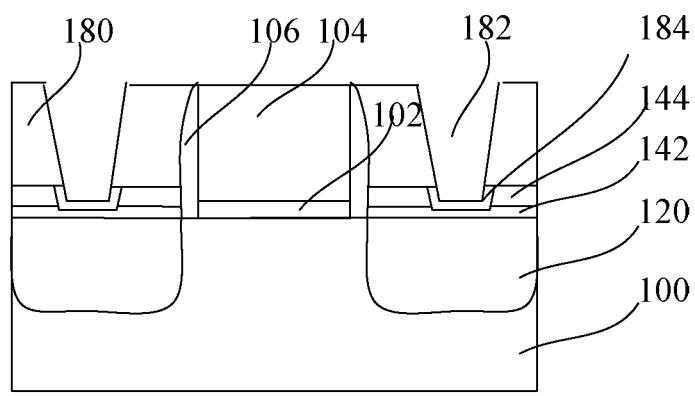
FIG. 5 is a structural diagram of a second embodiment of a contact hole according to the present invention.

Specifically, as illustrated in FIG. 5, in a second embodiment of the contact hole 182 (herein, the S/D region is implemented by the technical solution provided in the first embodiment), after the contact region 184 is formed on the top surface of the S/D region exposed by the contact hole 182, the interface between the contact region 184 and the S/D region is above the interface between the gate stack structure and the substrate 100. In other embodiments of the contact hole 182, the interface between the contact region 184 and the S/D region may coincide with the interface between the gate stack structure and the substrate 100.

The contact region 184 herein refers to, in case a silicon substrate is selected, a metal silicide formed for a better contact between the silicon and the conductive material subsequently deposited in the contact hole 182. The metal silicide may be formed, after the contact hole 182 is formed, by firstly forming a metal layer (including one of Co, Ni, Mo, Pt and W or any combination thereof) to cover the substrate 100, then performing a thermal processing operation (e.g., a rapid thermal processing or a rapid thermal annealing) of the substrate 100 on which the metal layer is formed, and finally removing the unreacted metal layer.

To be noted, in each of the embodiments of the contact hole provided in the present invention, the contact hole 182 is embedded into the S/D region, i.e., when the contact hole 182 is formed, a groove needs to be formed on the top surface of the S/D region, and contact regions shall be formed at the bottom side 1822 and the sidewalls 1824 of the groove, respectively, so that the contact hole 182 abuts the S/D region via a portion of its side surface close to the bottom surface, as well as via its bottom surface (herein the bottom surface refers to the bottom side 1822 of the groove). This increases the contact area and contributes to reduction of the contact resistance, as compared with the technical solution in which the contact hole 182 abuts the S/D region only via its bottom surface. Further, the profile of the sidewalls 1824 of the groove may be adjusted using different etching processes.

The present invention further provides a method for forming an S/D region.

In a first embodiment of the method for forming the S/D region, the method includes the following steps.

Figure 6:
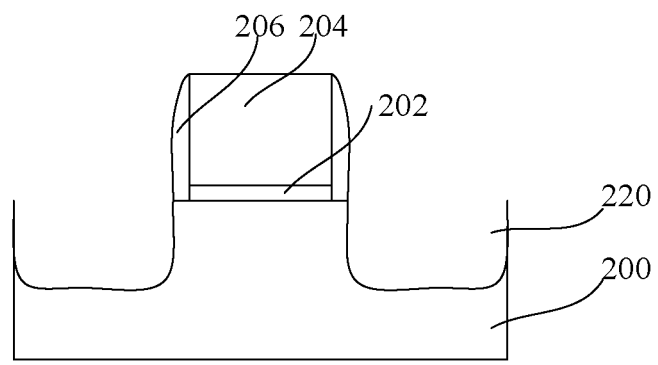
FIGS. 6-8 illustrate schematic diagrams of intermediate structures when implementing respective steps of a first embodiment of a method for forming an S/D region according to the present invention.

Firstly, as illustrated in FIG. 6, trenches 220 are formed at both sides of a gate stack structure in a substrate 200.

The substrate 200 has undergone processing operations including pre-cleaning, formation of well region and formation of shallow trench isolation (STI) region. In the present embodiment, the substrate 200 is a silicon substrate. In other embodiments, the substrate 200 may further include other compound semiconductor, such as silicon carbide (SiC), gallium arsenide (GaAs), indium arsenide (InAs) or indium phosphide (InP). In addition, the substrate preferably includes an epitaxial layer, and the substrate may also include a silicon on insulator (SOI) structure.

The gate stack structure includes a gate dielectric layer 202 formed on the substrate 200, a gate 204 formed on the gate dielectric layer 202, and sidewall spacers 206 surrounding the gate dielectric layer 202 and the gate 204. The gate 204 may be a poly-silicon gate, a poly-silicon dummy gate or a metal gate (It is to be noted that in this specification, the gate 204 is a poly-silicon gate or a poly-silicon dummy gate in the description of the embodiments of the method for forming the S/D region; and the gate 204 may be a poly-silicon gate or a metal gate in the description of the embodiments of the method for forming a contact hole). The gate dielectric layer 202 may be made of hafnium-based materials such as one of $HfO_2$, HfSiO, HfSiON, HfTaO, HfTiO and HfZrO or any combination thereof. The sidewall spacers 206 may include one of SiN, SiO, SiON and SiC or any combination thereof. The sidewall spacers may have a multi-layer structure. The gate dielectric layer 202, the sidewall spacers 206 and the above processing operations may be formed or performed by conventional processes.

The trench 220 may be formed by using a wet and/or dry etching process. The profile of the trench 220 may be adjusted by using different etching processes.

Figure 7:
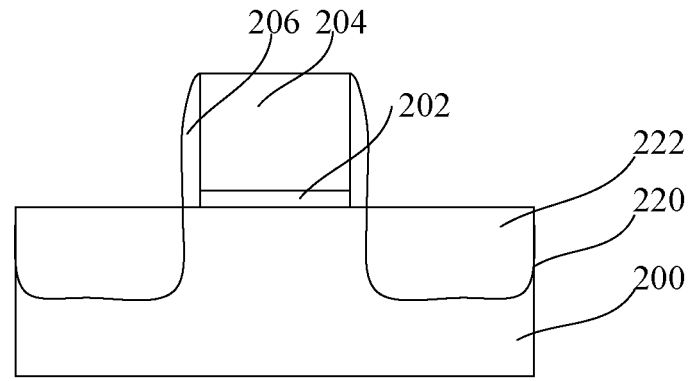

Next, as illustrated in FIG. 7, a first semiconductor layer 222 is formed to fill the trench 220.

The first semiconductor layer 222 is made of a material which includes Si, SiGe (the atomic percent of Ge may be 40%, and the content of Ge may be flexibly adjusted according to the process requirement, e.g., 30%-50%; unless otherwise specified, the atomic percent of Ge in this specification is the same as that indicated herein and will not be described repeatedly) or $Si_{1-x}C_x$ (the atomic percent of C may be 0-2%, and the content of C may be flexibly adjusted according to the process requirement; unless otherwise specified, the atomic percent of C in this specification is the same as that indicated herein and will not be described repeatedly). To be noted, the first semiconductor layer 222 may be a semiconductor material doped with ions, e.g., Si, SiGe or $Si_{1-x}C_x$ of N type or P type. The ion doping operation may be performed directly during the process of forming the first semiconductor layer 222 (e.g., doping a reactant containing the doped ion components into the reactants for producing the first semiconductor layer 222), or performed through an ion implantation process after the semiconductor material required for forming the S/D region is produced. Any conventional ion implantation process may be adopted to perform the ion doping operation, which herein is not described in detail.

The first semiconductor layer 222 may be formed by adopting pulse laser deposition (PLD), atomic layer deposition (ALD), plasma enhanced atomic layer deposition (PEALD) or other appropriate processes.

In the present embodiment, in the CMOS device including the S/D region, the first semiconductor layer 222 in the PMOS device is made of SiGe, and the first semiconductor layer 222 in the NMOS device is made of $Si_{1-x}C_x$, so that the first semiconductor layer 222 provides a compressive stress to the channel region of the PMOS device, and provides a tensile stress to the channel region of the NMOS device. This contributes to improvement of the performance of the CMOS device. In other embodiments of the S/D region, the first semiconductor layers 222 in the PMOS and NMOS devices may use other different semiconductor materials. The first semiconductor layer 222 in the PMOS device may be made of a material the same as that of the first semiconductor layer 222 in the NMOS device. In this case, in order that the first semiconductor layer 222 provides a compressive stress to the channel region of the PMOS device and provides a tensile stress to the channel region of the NMOS device, the first semiconductor layers 222 in the PMOS and NMOS devices may be formed by adopting different processes.

Figure 8:
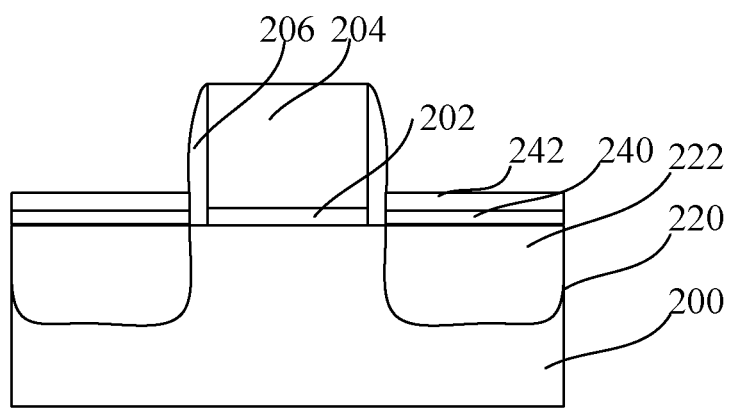

Next, as illustrated in FIG. 8, a stop layer 240 and an auxiliary layer 242 are formed sequentially. The auxiliary layer 242 is configured to bear a contact hole when the embedded contact hole is formed on the S/D region. The stop layer 240 is configured to terminate the contact hole above the interface between the gate stack structure and the substrate 200.

The stop layer 240 and the auxiliary layer 242 may be formed by adopting pulse laser deposition (PLD), atomic layer deposition (ALD), plasma enhanced atomic layer deposition (PEALD) or other appropriate processes.

In the present embodiment, the stop layer 240 and the auxiliary layer 242 in the PMOS device are made of a material the same as those of the stop layer 240 and the auxiliary layer 242 in the NMOS device, respectively. In other words, the stop layers 240 and the auxiliary layers 242 in the PMOS and NMOS devices are synchronously formed, which not only reduces the contact resistance, but also simplifies the process. Specifically, when the first semiconductor layer 222 in the PMOS device is SiGe and the first semiconductor layer 222 in the NMOS device is $Si_{1-x}C_x$, the auxiliary layer 242 is preferably made of SiGe, or $Si_{1-x}C_x$. The stop layer 240 may be made of Si (in practice, with respect to the 32 nm process, the thickness of the stop layer 240 may be 5 nm). In this case, it is also possible to adjust the stresses in the channel regions of the PMOS device and the NMOS device by selecting the materials or the formation process of the stop layers 240 and the auxiliary layers 242 in the PMOS and NMOS devices. The detailed adjusting method is the same as the method for adjusting the stress in the channel region of the device by utilizing the first region, and herein is not described in detail.

In different embodiments of the S/D region, the stop layers 240 and the auxiliary layers 242 in the PMOS and NMOS devices may be made of a material different from each other. In this case, the stop layers 240 and the auxiliary layers 242 in the PMOS and NMOS devices need to be formed separately.

In different embodiments of the S/D region, an interface between the stop layer 240 and the first semiconductor layer 222 may coincide with or be located above the interface between the gate stack structure and the substrate 200. When the interface between the stop layer 240 and the first semiconductor layer 222 is flushed with the interface between the gate stack structure and the substrate 200, it contributes to the compatibility of the technical solution of the present invention with the existing formation process of the S/D region. When the interface between the stop layer 240 and the first semiconductor layer 222 is located above the interface between the gate stack structure and the substrate 200, an interface between the S/D region and a contact region (e.g., a metal silicide layer formed by depositing metals on the S/D region and performing an annealing operation, the metal material includes one of Co, Ni, Mo, Pt and W or any combination thereof), which is introduced after the embedded contact hole is formed in the auxiliary layer 242 and the stop layer 240 to reduce the contact resistance between the conductive material (e.g., metals) filled into the contact hole and the S/D region, may be formed above the interface between the gate stack structure and the substrate 200 through process adjustment. This contributes to reduction of the stress loss of the channel region of the device, and improvement of the mobility of the carrier.

In a second embodiment of the method for forming the S/D region, the method includes the following steps.

Firstly, trenches are formed at both sides of a gate stack structure in a substrate.

Then, a first semiconductor layer is formed to fill the trench.

The related processes concerned are the same as those described in the previous embodiment, and herein are not repeated.

Figure 9:
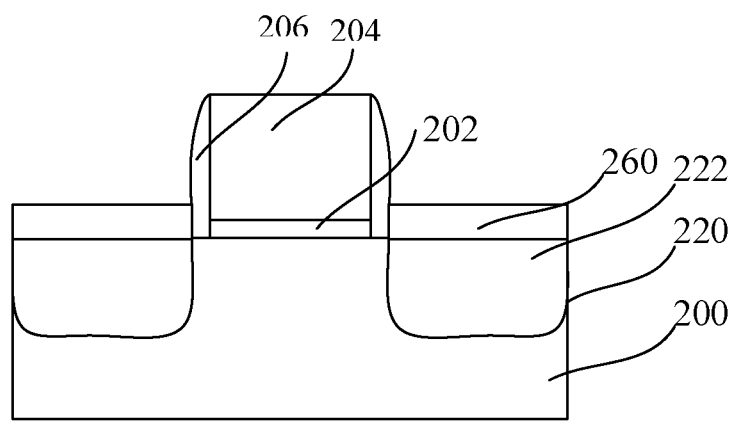
FIG. 9 illustrates a schematic diagram of an intermediate structure after implementing a second embodiment of a method for forming an S/D region according to the present invention.

Next, as illustrate in FIG. 9 and in conjunction with FIGS. 6 and 7, a second semiconductor layer 260 is formed on the first semiconductor layer 222, and the second semiconductor layer 260 is made of a material different from that of the first semiconductor layer 222.

The second semiconductor layer 260 is made of a material which includes Si, SiGe or $Si_{1-x}C_x$. It is to be noted that the second semiconductor layer 260 may be made of a semiconductor material doped with ions, e.g., Si, SiGe or $Si_{1-x}C_x$ of N type or P type. The ion doping operation may be performed during the process of forming the second semiconductor layer 260 (e.g., doping a reactant containing the doped ion components into the reactants for producing the second semiconductor layer 260), or performed through an ion implantation process after the semiconductor material required for forming the S/D region is produced. Any conventional ion implantation process may be adopted to perform the ion doping operation, and herein is not described in detail.

The second semiconductor layer 260 may be formed by adopting pulse laser deposition (PLD), atomic layer deposition (ALD), plasma enhanced atomic layer deposition (PEALD) or other appropriate processes.

In the present embodiment, in the CMOS device including the S/D region, the first semiconductor layer 222 in the PMOS device is made of SiGe, the first semiconductor layer 222 in the NMOS device is made of $Si_{1-x}C_x$, and the second semiconductor layers 260 in the PMOS and NMOS devices may be made of Si; that is, the second semiconductor layer 260 in the PMOS device is made of a material the same as that of the second semiconductor layer 260 in the NMOS device. In other words, the second semiconductor layers 260 in the PMOS and NMOS devices are synchronously formed, which not only reduces the contact resistance, but also simplifies the process.

As the second semiconductor layer 260 is made of a material different from that of the first semiconductor layer 222, the contact hole subsequently formed on the S/D region may terminate above the interface between the gate stack structure and the substrate 200. A groove that bears the contact hole may be formed in the second semiconductor layer 260 and terminate above the first semiconductor layer 222 by selecting appropriate etchant, and then the profile of the groove can be adjusted by adjusting the thickness of the second semiconductor layer 260, so as to flexibly adjust the size of the contact area.

An interface between the second semiconductor layer 260 and the first semiconductor layer 222 may coincide with or be located above the interface between the gate stack structure and the substrate 200. When the interface between the second semiconductor layer 260 and the first semiconductor layer 222 is flushed with the interface between the gate stack structure and the substrate 200, it contributes to the compatibility of the technical solution of the present invention with the existing formation processes of the S/D region. When the interface between the second semiconductor layer 260 and the first semiconductor layer 222 is located above the interface between the gate stack structure and the substrate 200, an interface between the S/D region and a contact region, which is introduced after the embedded contact hole is formed in the second semiconductor layer 260 to reduce the contact resistance between the conductive material (e.g., metals) filled into the contact hole and the S/D region, may be formed above the interface between the gate stack structure and the substrate 200 through process adjustment. This contributes to reduction of stress loss of the channel region of the device, and improvement of the mobility of the carrier.

In a third embodiment of the method for forming the S/D region, the method includes the following steps.

Firstly, trenches are formed at both sides of a gate stack structure in a substrate.

The related process concerned is the same as that described in the previous embodiment, and herein is not repeated.

Figure 10:
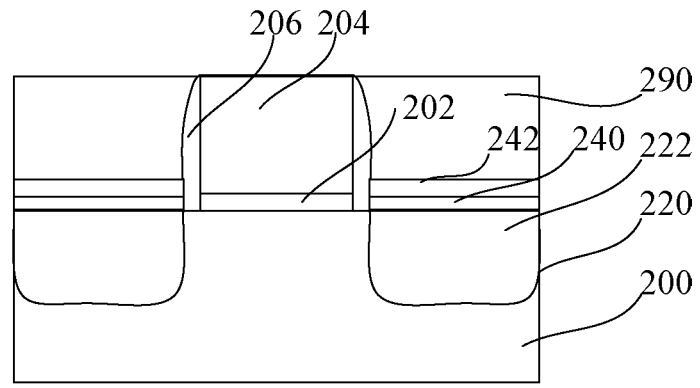
FIGS. 10-11 illustrate schematic diagrams of intermediate structures when implementing respective steps of a first embodiment of a method for forming a contact hole according to the present invention.

Next, as illustrate in FIG. 10 and in conjunction with FIG. 6, a semiconductor layer 280 is formed to fill the trench 220, and the height difference between the top surface of the semiconductor layer 280 and the interface between the gate stack structure and the substrate 200 is larger than a difference between the actual height and the target height of the semiconductor layer.

As compared with the solution in the second embodiment of the method for forming the S/D region, the solution in the present embodiment is equivalent to the solution in which the second semiconductor layer 260 is made of a material the same as that of the first semiconductor layer 222. In this case, in the CMOS device including the S/D region, the S/D region in the PMOS device is made of SiGe, and the S/D region in the NMOS device is made of $Si_{1-x}C_x$, so that the first semiconductor layer provides a compressive stress to the channel region of the PMOS device, and provides a tensile stress to the channel region of the NMOS device. This contributes to improvement of the performance of the CMOS device. The technical solution of the present invention is well compatible with the existing formation processes of the S/D region. As compared with the existing process for forming S/D region, the technical solution of the present embodiment only requires the formed S/D region to be thicker, i.e., the height difference between the top surface of the S/D region and the interface between the gate stack structure and the substrate 200 shall be larger than a difference between the actual height and the target height of the S/D region in prior art.

Figure 11:
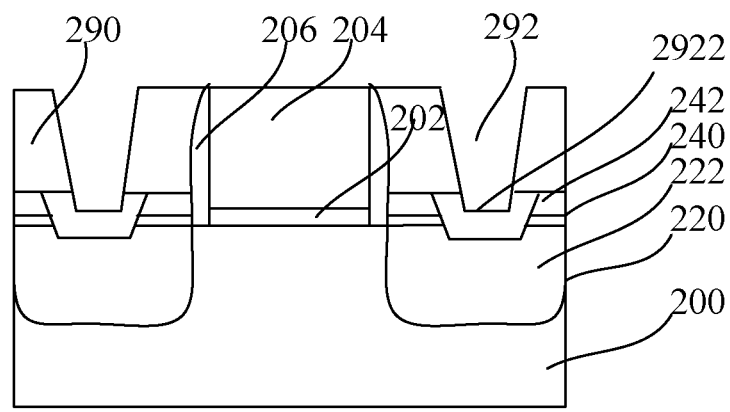

The present invention further provides a method for forming a contact hole. On the basis of the above embodiments of the method for forming the S/D region, after an interlayer dielectric layer 290 is formed and planarized on the S/D region (see FIG. 11), the interlayer dielectric layer 290, the auxiliary layer 242 and the stop layer 240 are patterned (corresponding to the first embodiment of the method for forming the S/D region), or, the interlayer dielectric layer and the second semiconductor layer are patterned (corresponding to the second embodiment of the method for forming the S/D region), or the interlayer dielectric layer and the above semiconductor layer with a certain depth are patterned (corresponding to the third embodiment of the method for forming the S/D region), so as to form a contact hole penetrating the interlayer dielectric layer 290 and terminating in the S/D region.

Figure 12:
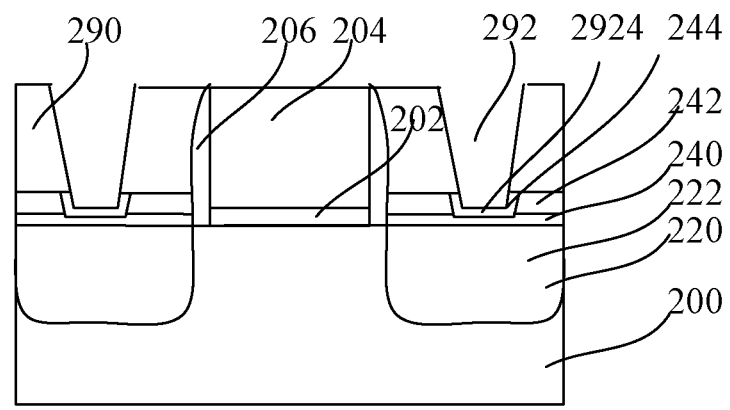
FIG. 12 illustrates schematic diagrams of intermediate structures when implementing a second embodiment of a method for forming a contact hole according to the present invention.

As illustrated in FIG. 12, in the first embodiment of the method for forming the contact hole (herein, the S/D region is formed by the technical solution provided in the first embodiment, and obviously, the present embodiment is also applicable for the cases omitted for simplification in which the S/D region is formed by the technical solution provided in the second or third embodiment), an interface between the bottom surface 2922 of a contact hole 292 and the S/D region is above the interface between the gate stack structure and the substrate 200. An interface between the S/D region and a contact region, which is introduced after the contact hole is formed to reduce the contact resistance between the conductive material (e.g., metals) filled into the contact hole 182 and the S/D region, may be formed above the interface between the gate stack structure and the substrate through process adjustment. This contributes to reduction of the stress loss of the channel region of the device, and improvement of the mobility of the carrier.

In other embodiments of the method for forming the contact hole, the interface between the bottom surface of the contact hole and the S/D region may coincide with the interface between the gate stack structure and the substrate. This contributes to the compatibility of the technical solution of the present invention with the existing formation processes of the contact hole.

Specifically, as illustrated in FIG. 13, in the second embodiment of the contact hole (herein, the S/D region is formed by the technical solution provided in the first embodiment, and obviously, the present embodiment is also applicable for the cases omitted for simplification in which the S/D region is formed by the technical solution provided in the first or third embodiment), after a contact region 244 is formed on the top surface of the S/D region exposed by the contact hole 292, an interface between the bottom surface 2924 of the contact region 244 and the S/D region is above the interface between the gate stack structure and the substrate 200. In other embodiments of the contact hole, the interface between the bottom surface 2924 of the contact region 244 and the S/D region may coincide with the interface between the gate stack structure and the substrate. Both cases contribute to reduction of the stress loss of the channel region of the device, and improvement of the mobility of the carrier.

Furthermore, the scope of the present invention is not limited to the processes, structures, manufacturing, compositions, means, methods and steps of the specific embodiments as described in the specification. According to the disclosure of present invention, a person skilled in the art will easily appreciate that, when the processes, structures, manufacturing, compositions, means, methods and steps currently existing or to be developed in future are adopted to perform functions substantially the same as corresponding embodiments described in the present invention, or achieve substantially the same effects, a person skilled in the art can make applications of them under the teaching of the present invention, without deviating from the scope of the present invention.

What is claimed is:

1. An S/D region being made of a semiconductor material, located at both sides of a gate stack structure and embedded into a substrate, comprising:
   a first region located, with at least a partial thickness, in the substrate; and
   a second region formed on the first region, and made of a material different from that of the first region,
   wherein the second region comprising:
   an auxiliary layer configured to bear an embedded contact hole, at least part of the contact hole being formed in the S/D region and surrounded by the auxiliary layer; and
   a stop layer arranged between the auxiliary layer and the first region, where the stop layer comprises a material different from that of the auxiliary layer and a portion of an upper surface of the stop layer facing the contact hole is above an interface between the gate stack structure and the substrate.

2. The S/D region according to claim 1, wherein the stop layer is configured to terminate the contact hole above the interface between the gate stack structure and the substrate.

3. The S/D region according to claim 2, wherein in a PMOS device formed on the substrate of Si, the first region is made of SiGe, the stop layer is made of Si, and the auxiliary layer is made of SiGe.

4. The S/D region according to claim 2, wherein in an NMOS device formed on the substrate of Si, the first region is made of Si1-xCx, the stop layer is made of Si, and the auxiliary layer is made of SiGe.

5. The S/D region according to claim 1, wherein in a CMOS device including the S/D region, the first region provides a compressive stress to a channel region of a PMOS device, and provides a tensile stress to a channel region of an NMOS device.

6. The S/D region according to claim 5, wherein the first region in the PMOS device is made of a material different from that of the first region in the NMOS device.

7. The S/D region according to claim 6, wherein the second region in the PMOS device is made of a material the same as that of the second region in the NMOS device.

8. A contact hole, wherein the contact hole is embedded into the S/D region according to claim 1, and an interface between the bottom surface of the contact hole and the S/D region is above or flushed with the interface between the gate stack structure and a the substrate.

9. The contact hole according to claim 8, wherein after a contact region is formed on the top surface of the S/D region exposed by the contact hole, the interface between the bottom surface of the contact region and the S/D region is above or flushed with the interface between the gate stack structure and the substrate.

10. A contact hole, wherein the contact hole is embedded into an S/D region, the S/D region comprising at least a stop layer and an auxiliary layer on the stop layer, wherein a portion of an upper surface of the stop layer facing the contact hole is above an interface between a gate stack structure and a substrate; and the auxiliary layer comprises a material different from that of the stop layer;

the contact hole is formed in the auxiliary layer and at least a part of the contact hole is surrounded by the auxiliary layer;

an interface between a bottom surface of the contact hole and the S/D region is above or flushed with the interface between the gate stack structure and the substrate; the S/D region is made of a semiconductor material, located at both sides of the gate stack structure and embedded into the substrate; and the height difference between the top surface of the S/D region and the interface between the gate stack structure and the substrate is larger than a difference between an actual height and a target height of the S/D region.

11. The contact hole according to claim 10, wherein after a contact region is formed on the top surface of the S/D region exposed by the contact hole, the interface between the bottom surface of the contact region and the S/D region is above or flushed with the interface between the gate stack structure and the substrate.

12. A method for forming an S/D region, comprising:
forming trenches at both sides of a gate stack structure in a substrate;
forming a first semiconductor layer, wherein at least a part of the first semiconductor layer is filled into the trenches; and
forming a second semiconductor layer on the first semiconductor layer, wherein at least a part of the second semiconductor layer is made of a material different from that of the first semiconductor layer,
wherein the step of forming the second semiconductor layer comprising:
forming a stop layer on the first semiconductor layer, wherein a portion of an upper surface of the stop layer facing the contact hole is above an interface between the gate stack structure and the substrate;
forming an auxiliary layer on the stop layer, wherein the stop layer and the auxiliary layer are formed from different materials, the auxiliary layer being configured to bear an embedded contact hole, at least part of the contact hole being formed in the S/D region and surrounded by the auxiliary layer.

13. The method according to claim 12, wherein
the stop layer is configured to terminate the contact hole above the interface between the gate stack structure and the substrate.

14. The method according to claim 13, wherein in a PMOS device formed on the substrate of Si, the first region is made of SiGe, the stop layer is made of Si, and the auxiliary layer is made of SiGe.

15. The method according to claim 13, wherein in an NMOS device formed on the substrate of Si, the first region is made of Si1-xCx, the stop layer is made of Si, and the auxiliary layer is made of SiGe.

16. The method according to claim 12, wherein in a CMOS device including the S/D region, the first semiconductor layer provides a compressive stress to a channel region of a PMOS device, and provides a tensile stress to a channel region of an NMOS device.

17. The method according to claim 16, wherein the first semiconductor layer in the PMOS device is made of a material different from that of the first semiconductor layer in the NMOS device.

18. The method according to claim 17, wherein the second semiconductor layer in the PMOS device is made of a material the same as that of the second semiconductor layer in the NMOS device.

19. A method for forming a contact hole, comprising:
forming an S/D region by the method according to claim 12; and
etching the auxiliary layer to form a contact hole in the S/D region, the etching stops at the stop layer, wherein an interface between the bottom surface of the contact hole and the S/D region is above or flushed with an interface between the gate stack structure and the substrate.

20. The method according to claim 19, wherein after a contact region is formed on the top surface of the S/D region exposed by the contact hole, the interface between the bottom surface of the contact region and the S/D region is above or flushed with the interface between the gate stack structure and the substrate.

21. A method for forming a contact hole, comprising:
forming trenches at both sides of a gate stack structure in a substrate;
forming a semiconductor layer in the trenches, wherein the height difference between the top surface of the semiconductor layer and an interface between the gate stack structure and the substrate is larger than a difference between an actual height and a target height of the semiconductor layer, the semiconductor layer comprises at least a stop layer and an auxiliary layer on the stop layer, a portion of an upper surface of the stop layer facing the contact hole is above an interface between the gate stack structure and the substrate, and the auxiliary layer comprises a material different from that of the stop layer; and
forming a contact hole in the auxiliary layer by etching the auxiliary layer, the etching stops at the stop layer, wherein an interface between the bottom surface of the contact hole and the semiconductor layer is above or flushed with the interface between the gate stack structure and the substrate and at least a part of the contact hole is surrounded by the semiconductor layer.

22. The method according to claim 21, wherein after a contact region is formed on the top surface of the S/D region exposed by the contact hole, the interface between the bottom surface of the contact region and the S/D region is above or flushed with the interface between the gate stack structure and the substrate.

* * * * *